(12) United States Patent
Kim et al.

(10) Patent No.: US 10,153,162 B2
(45) Date of Patent: Dec. 11, 2018

(54) SHRINK PROCESS AWARE ASSIST FEATURES

(71) Applicant: GLOBALFOUNDRIES Inc., Grand Caymen (KY)

(72) Inventors: Ryan Ryoung-Han Kim, Bertem (BE); Wenhui Wang, Santa Clara, CA (US); Azat Latypov, San Jose, CA (US); Tamer Coskun, Jr., San Jose, CA (US); Lei Sun, Albany, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 122 days.

(21) Appl. No.: 15/284,773

(22) Filed: Oct. 4, 2016

(65) Prior Publication Data
US 2018/0096839 A1   Apr. 5, 2018

(51) Int. Cl.
| | |
|---|---|
| *H01L 21/306* | (2006.01) |
| *H01L 21/8234* | (2006.01) |
| *H01L 21/027* | (2006.01) |
| *H01L 21/033* | (2006.01) |
| *H01L 21/308* | (2006.01) |
| *H01L 21/311* | (2006.01) |
| *H01L 21/3213* | (2006.01) |
| *H01L 21/66* | (2006.01) |

(52) U.S. Cl.
CPC ...... *H01L 21/0276* (2013.01); *H01L 21/0337* (2013.01); *H01L 21/3086* (2013.01); *H01L 21/30604* (2013.01); *H01L 21/31144* (2013.01); *H01L 21/32139* (2013.01); *H01L 21/823431* (2013.01); *H01L 21/823481* (2013.01); *H01L 22/12* (2013.01); *H01L 22/30* (2013.01)

(58) Field of Classification Search
CPC .......... H01L 21/0276; H01L 21/30604; H01L 22/12; H01L 22/30; H01L 21/823431; H01L 21/823481
See application file for complete search history.

(56) References Cited

U.S. PATENT DOCUMENTS

| | | | | |
|---|---|---|---|---|
| 6,740,473 | B1 | 5/2004 | Lin et al. | |
| 8,384,224 | B2 * | 2/2013 | Ding | H01L 21/6835 257/774 |
| 8,981,465 | B2 * | 3/2015 | Chen | H01L 29/7827 257/330 |
| 9,728,462 | B2 * | 8/2017 | Fan | H01L 21/823456 |
| 9,812,354 | B2 * | 11/2017 | Grivna | H01L 21/76831 |
| 2004/0248375 | A1 * | 12/2004 | McNeil | H01L 21/76229 438/435 |

(Continued)

*Primary Examiner* — Savitr Mulpuri
(74) *Attorney, Agent, or Firm* — Heslin, Rothenberg Farley & Mesiti P.C.

(57) ABSTRACT

Methods for fabricating integrated circuits are provided. In one example, a method includes providing a circuit structure layer over a substrate and at least one etch layer over the circuit structure layer, in the at least one etch layer patterning at least one primary pattern feature having at least one primary pattern feature dimension and at least one assist pattern feature having at least one assist pattern feature dimension, where the primary pattern feature dimension is greater than the assist pattern feature dimension, reducing the at least one primary pattern feature dimension and closing the assist pattern feature to form an etch pattern, and etching a circuit structure feature using the etch pattern.

17 Claims, 8 Drawing Sheets

(56) References Cited

U.S. PATENT DOCUMENTS

| | | | |
|---|---|---|---|
| 2006/0189137 A1* | 8/2006 | Anderson | H01L 21/31144 438/691 |
| 2014/0308810 A1* | 10/2014 | Ko | H01L 21/475 438/653 |
| 2015/0064912 A1* | 3/2015 | Jang | H01L 21/3086 438/696 |
| 2015/0126034 A1 | 5/2015 | Latypov et al. | |
| 2015/0235839 A1 | 8/2015 | Coskun et al. | |
| 2015/0294876 A1* | 10/2015 | Lee | H01L 21/28282 438/591 |
| 2015/0357434 A1* | 12/2015 | Jang | H01L 29/66545 438/587 |
| 2016/0247686 A1 | 8/2016 | Latypov et al. | |
| 2017/0186688 A1* | 6/2017 | Singh | H01L 23/5226 |

* cited by examiner

SHRINK PROCESS AWARE ASSIST FEATURES

TECHNICAL FIELD

The technical field relates generally to methods for fabricating integrated circuits, and more particularly relates to methods for fabricating integrated circuits including shrink processing of aware assist features.

BACKGROUND

Decreasing device size and increasing device density has traditionally been a high priority for the manufacturing of integrated circuits. Lithography has been the driving force for device scaling. Conventional optical lithography is limited to about 80 nm pitch for single exposure patterning. Whilst double and other multi-patterning processes can realize smaller pitch, these approaches are expensive and more complex.

Patterning of isolated features in a semiconductor device during fabrication may involve depositing a layer or layers over a substrate or other layer in or on which a feature is to be constructed, patterning the overlaying layer or layers to create regions through which the underlying substrate or other layer may be modified, modifying the underlying substrate or other layer in such regions, then removing some or all of the overlaying layer or layers to reveal the modified underlying substrate or other layer. Optical lithography may be used for patterning the overlaying layer or layers. For example, a hard mask may be deposited over the underlying substrate or layer, then a resist layer capable of being patterned by an optical lithography process deposited above the hard mask. Small features may then be patterned in the resist layer, such as through use of an optical lithography mask layered upon the resist layer, permitting subsequent modification of regions of the hard mask and, ultimately, underlying substrate or other layer, according to where the resist layer was patterned.

A difficulty arises when small features must be patterned in a resist in accordance with this or related procedures. Smaller features may have a greater variability in particular critical dimensions, from one feature to another or at different points within a feature, resulting in disadvantageous variability in semiconductor device structure. Such variability is greater for features that are patterned in relative geometric isolation with regard to other features. To ameliorate this problem, conventionally, non-printing lithographic assist features (SRAFs, Subresolution Assist Features) may be made during target feature processing. Assist features may be a multiplicity of features patterned into a resist or lithographic mask layer near a target isolated feature, but not subsequently etched or patterned into the underlying layer. Depositing such assist features in proximity to a target feature can improve the process window the target feature, rendering the target feature less isolated and thereby improving uniformity of geometry, without resulting in adding superfluous or unwanted features in the underlying substrate or other layer because such assist features are not subsequently pattered therein despite initially being patterned into the resist layer. Thus, these non-printing lithographic assist features help to improve the process window by reducing the sensitivity to lithographic process variations, such as variations of dose and focus. The size of these non-printing lithographic assist features is relatively small such that they do not print or transfer to the photoresist layer and otherwise produce unintended features in the integrated circuit. Unfortunately, the relatively small size of these non-printing lithographic assist features limits their benefit for improving the lithographic process window.

The process window for an isolated target feature is improved more with larger assist features than with smaller assist features. However, larger assist features may end up being patterned onto the underlying substrate or other layer, resulting in creation of superfluous unwanted features in addition to the intended target feature, offsetting the benefit larger assist features confer on the process window of a target feature. Thus, a method of improving the process window of target features during semiconductor manufacturing is needed

BRIEF SUMMARY

Methods for fabricating integrated circuits are provided herein. In accordance with an exemplary embodiment, a method for method of fabricating a circuit structure feature includes providing a circuit structure layer over a substrate and at least one etch layer over the circuit structure layer; forming a pattern in the at least one etch layer, which includes patterning at least one primary pattern feature having at least one primary pattern feature dimension and at least one assist pattern feature having at least one assist pattern feature dimension, where the primary pattern feature dimension is greater than the assist pattern feature dimension; reducing the at least one primary pattern feature dimension and closing the assist pattern feature to form an etch pattern; and etching the circuit structure feature using the etch pattern.

In some embodiments, the at least one etch layer includes a plurality of etch layers, and the at least one assist pattern feature is formed in one etch layer of the plurality of etch layers without being formed in other layers of the plurality of etch layers. The one etch layer may be a photo-resist layer, and the other layers of the plurality of etch layers may be an anti-reflective coating layer disposed below the photo-resist layer and an organic planar layer disposed below the anti-reflective coating layer. In another example, the one the etch layer may be a hard mask layer, and the other layers of the plurality of etch layers may be an anti-reflective coating layer disposed below the photo-resist layer and an organic planar layer disposed below the anti-reflective coating layer.

In some examples, the method includes increasing the at least one dimension of the primary pattern feature after reducing the at least one dimension of the primary pattern feature. In other examples, the at least one dimension of the primary pattern feature may be a length or a width of the primary pattern feature, or the at least one assist feature may be a plurality of assist feature dimensions and the plurality of assist feature dimensions are smaller than the at least one primary feature dimension. In still other examples, the at least one assist feature may include at least one polygon-shaped hole formed in the at least one etch layer.

In still other examples, the at least one assist feature is one assist feature of a plurality of assist features, the plurality of assist features further facilitating forming the primary pattern feature. In still other examples, the plurality of assist features are arranged asymmetrically with respect to each other. The asymmetrically arranged plurality of assist features may have a variable spacing between one assist feature and one or more adjacent assist features. In some embodiments, the plurality of assist features may be a plurality of polygon-shaped holes.

In still further embodiments, the primary pattern feature includes a trench formed in the at least one etch layer, and reducing the at least one dimension of the primary pattern feature includes depositing a material over the at least one etch layer, the material at least partially filling the trench to reduce the at least one dimension of the primary pattern feature. In some examples, the material includes a hard mask layer.

In other examples, a method may further include, before patterning the at least one etch layer, determining if the at least one assist feature may be completely closed by the reducing the at least one dimension of the primary pattern feature. In some examples, the at least one assist feature may include a polygon-shaped assist feature, and determining may include applying an inward bias to the polygon shape of the assist feature, the inward bias corresponding to the reducing, to detect whether the polygon shape deforms as a result of applying the inward bias, the deformation corresponding to complete closure of the at least one assist feature. In yet other examples, the polygon shape may not deform as a result of applying the inward bias, and the method includes altering one or more dimensions of the at least one assist feature so that the at least one assist feature will be completely closed by the reducing.

In further examples, the at least one assist feature may include a shape defined by a closed contour, and the determining may include providing a measurement circle, the measurement circle having a radius corresponding to the reducing, and comparing the measurement circle to the closed contour of the at least one assist feature to detect if the circle is larger than the closed contour. In an example, the measurement circle may be smaller than the closed contour, the measurement circle being smaller than the closed contour corresponding to incomplete closure of the at least one assist feature, and the method may include altering one or more dimensions of the at least one assist feature so that the at least one assist feature will be completely closed by the reducing.

BRIEF DESCRIPTION OF THE DRAWINGS

Various, non-limiting embodiments will hereinafter be described in conjunction with the following drawing figures, wherein like numerals denote like elements, and wherein.

DETAILED DESCRIPTION

Figure 1A:
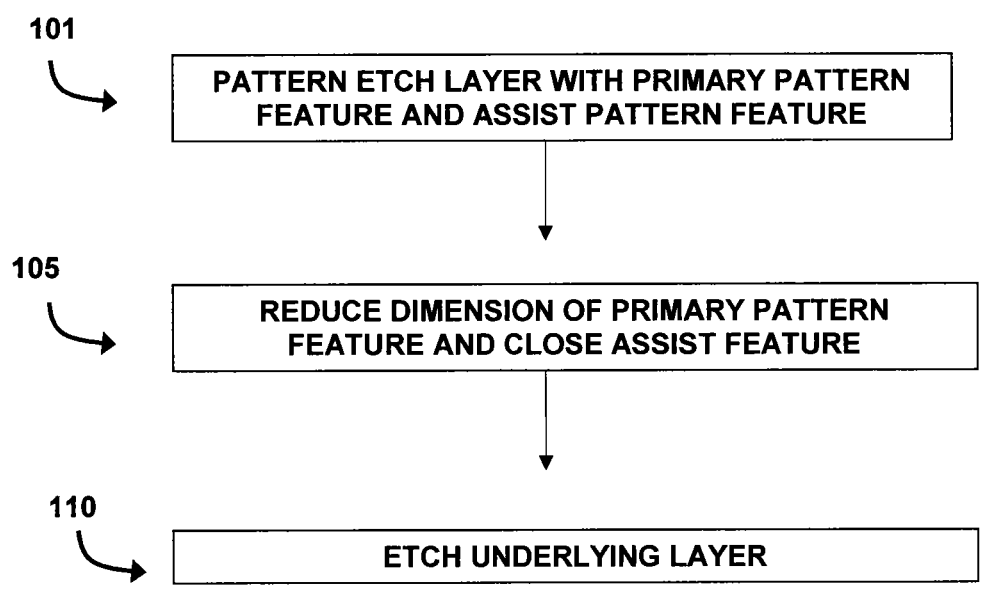
FIG. 1A illustrates a method of semiconductor manufacturing in accordance with an exemplary embodiment of the present disclosure.

The following Detailed Description is merely exemplary in nature and is not intended to limit the various embodiments or the application and uses thereof. Furthermore, there is no intention to be bound by any theory presented in the preceding background or the following detailed description.

Various embodiments contemplated herein relate to methods for fabricating integrated circuits. The exemplary embodiments taught herein employ formation of assist features during fabrication processing of a semiconductor device and formation of target features. Assist features is herein is understood to mean patterns included in lithographic patterning processes, such as patterned or formed in a resist layer, or patterned or formed in an optical or other lithographic mask layer above a resist layer, for the purposes of improving the process window of a target feature. Target feature as used herein is understood to mean patterns or features made in a layer. A target feature may be made in one layer with the intention of transferring (i.e., creating, recapitulating, copying, projecting, repeating, etc.) said target feature to an underlying layer or layers, such as a hard mask or other layer or layers underlying the resist layer, and/or features in other layers below a resist layer, for the purpose of forming structures in the semiconductor such as vias or contacts, trenches, fins, or the like. As used herein, a primary feature is understood to mean a target feature formed in a layer, such as a resist layer, to create a pattern for subsequent etching of an underlying layer or layers and formation of a target feature in the underlying layers or layer. A layer or layers under a resist layer to which a target feature may be transferred from a resist layer to said layer or layers include a hard mask layer, a silicon-rich anti-reflective coating layer, an etch stop layer, an oxide layer, an amorphous silicon layer, a hi-K dielectric layer, or other layer desired in which formation of a target feature in a semiconductor circuit, or during formation thereof, is desired.

In an exemplary embodiment, the topographical features are formed by lithographically printing the topographical features into a photoresist layer that overlies the semiconductor substrate. As used herein, the term 'semiconductor substrate' will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, 'semiconductor material' encompasses other materials such as relatively pure and impurity-doped germanium, gallium arsenide, zinc oxide, glass, and the like. An exemplary semiconductor material is a silicon substrate. The silicon substrate may be a bulk silicon wafer or may be a thin layer of silicon on an insulating layer (commonly known as silicon-on-insulator or SOI) that, in turn, is supported by a carrier wafer.

It has been found that by lithographically printing (e.g., patterning) assist features, the lithographic process window is improved for printing (e.g., patterning) the topographical target features into the photoresist layer. To prevent subsequent transferring of the pattern represented by assist features, disclosed herein is a method for closing or shrinking assist features after assist feature patterning but before etching a layer or layers underlying a lithographic resist layer to prevent formation of unwanted features therein.

In an exemplary embodiment, a resist layer may be patterned with a target feature or features and assist feature or features, using standard lithographic processing methods. The target feature may be formed by exposure of a resist layer using an optical, deep ultraviolet (DUV), or extreme ultraviolet (EUV) lithography tool, or out of developed e-beam resist that was exposed to an electronic beam using an e-beam lithography tool. Other techniques known to those skilled in the art may also be used to form a target feature, such as, for example, maskless EUV or DUV interference lithography, nano-imprint lithography, double DSA lithography, or the like. The methods of interference lithography, nano-imprint lithography, or double DSA lithography are particularly suited and can be used for forming large arrays of periodic features, used in various embodiments described herein. The target feature or features have a dimension or dimensions, which may induce a width, length, diameter, or other distance from one internal boundary to another. Likewise, the assist feature or features have a dimension or dimensions, which may induce a width, length, diameter, or other distance from one internal boundary to another. In some examples, assist features or target features may be circular holes, or polygonal holes. In some examples, assist features may be patterned in proximity to target features for the purpose of increasing the process window or target features given the beneficial effects assist features have on target feature process window.

Generally, where a target feature is relatively isolated from other target features, its process window may suffer from heterogeneity compared to less isolated target features. Heterogeneity may be from target feature to target feature or between different aspects of a given target feature such as its dimensions at different points, or depths, from the feature's surface. Formation of assist features in proximity to target features improves the target feature process window. Larger assist features promote advantageous target feature process window more than smaller assist features, but also may result in transferring of the large assist feature to underlying layers. According to the teaching of the present disclosure, assist features are shrunk or closed after lithographic processing, after they have beneficially affected the process window of target features, retaining said benefit but preventing unwanted transferring of the assist feature to other layers.

Several methods may be used in accordance with the present disclosure to affect closing or shrinkage of assist features. For example, after lithographic formation of an assist feature or features or a target feature or features in a resist layer, additional resist material may be conformally deposited thereon, resulting in shrinkage of the assist feature or features and target feature or features. Deposition may be carried out by any of numerous methods known by skilled artisans for conformal deposition of layers during semiconductor fabrication, such as atomic layer deposition, or other processes. That is, conformal deposition of additional material results in deposition of some material within assist features and target features. When a target feature has a greater dimension or dimensions than assist feature or features (e.g., greater width, length, diameter, or distance between internal surfaces), the target feature dimension will be reduced proportionally less than the corresponding assist feature dimension. For example, when assist features are smaller than target features, conformally depositing additional material on a lithographically patterned resist layer may result in closing off, or complete filling in of, assist features, while merely reducing the size of the target feature. During subsequent processing, the target feature or features would still be present in the resist layer, by nature of not having been completely filled in during conformal deposition of a covering layer, whereas the small assist features would no longer be present, having been closed off by conformal deposition.

Another exemplary embodiment of the present disclosure involves a process of shrinkage of features by modifying a layer after lithographic processing but before subsequent etching of an underlying layer or layers. For example, a resist layer may be patterned by lithographic patterning procedures, wherein an assist feature or features and a target feature or features are patterned into the resist layer. Subsequently, a layer may be conformably deposited on the resist layer, followed by processing which modifies the areas of the resist layer on which the conformally deposited layer was deposited, with the overall effect of expanding the thickness of the resist layer and, consequently, shrinking the assist and target feature or features. According to methods well known to skilled artisans, for example, a layer of acidic material may be conformally deposited on the resist layer, resulting in adsorption of some acidic material into surfaces of the resist material, including sidewalls of assist and target features or features. Subsequent thermal processing, including exposure of the partial semiconductor device to elevated temperature, may result in distribution of acidic material throughout more of the resist layer. In some example, the modification of the resist material results in expansion of the resist material, which in turn results in shrinkage of assist and target feature or features. In other examples, another layer may be deposited on the acid-modified resist layer, and subsequently exposed to an elevated temperature. Such processing may result in formation of an etch-resistant coating on the resist layer, which, again, results in shrinkage of assist and target feature or features. In these examples, an assist feature or features with a smaller dimension or dimensions than a target feature or features may be closed off by the shrinkage process, whereas a corresponding dimension or dimensions of a target feature features may be reduced in size, but proportionally less so that the assist feature or features, and the target feature or features would not be closed off.

After a dimension or dimensions of an assist feature or features are reduced in size, whether by deposition of another layer over the resist layer or other disclosed methods for feature shrinkage have been performed, an underlying layer or layers may be etched, transferring the target feature or features from the resist layer to underlying layer or layers. Assist features, having been closed off, would not be transferred. In some examples, after closing off and shrinking the dimension or dimensions of a target feature, but before etching the underlying layer or layers, the target feature may be expanded, such as by an etch step that is specific for the resist layer material or resist layer material and overlying layer as may have been deposited or created during a shrink step, relative to the layer underling the resist layer. For example, after forming a target feature in a resist layer and assist features to improve the process window of said target feature or features, and after closing off the assist feature or features and shrinking a dimension or dimensions of a target feature or features, the target feature as existing in the resist layer as shrunken may be smaller than would be needed to create the ultimately intended target feature in the underlying layer or layers.

In such circumstances, or others where a target feature or features in the resist layer larger than that or those existing in the resist layer following closing off of assist layers would be beneficial, it may be possible to perform an etch step on the shrunken target feature or features, removing some of the conformally deposited material or other material deposited or created during shrink processing. Such etching expands the shrunken target feature in the resist layer, such as by removing material from sidewalls thereof. But it would not result in reopening or creating new assist feature. Having been closed off, the assist features would not possess internal sidewalls that could be etched during this process. Subsequent etching of the layer or layers underlying the resist layer would therefore occur according to the dimension or dimension of the target feature or features existing after etching of target feature or features following closing off of the assist feature or features.

Symmetry in the patterning of assist features also may affect process window of target features. Asymmetry of assist features as used is herein is understood to mean a variable spacing between one assist feature and one or more adjacent assist features. For example, whereas assist features spaced equidistantly from each other would be understood to be symmetrical, patterning of assist features wherein some assist features are closer to some adjacent assist features and farther away from other adjacent assist features would be asymmetrical assist features. Asymmetry of assist features improves the process window of target features. Thus, in some examples in accordance with the present disclosure, assist features are patterned asymmetrically.

Assist features may also differ geometrically from target features, not just with regard to size of a dimension or dimensions but also with regard to the overall shape of assist features and target features. For example, in some instances, a target feature may be a hole, and a hole may be generally curved or circular in cross section, or may be polygonal in cross section, whereas an assist feature may be a trench. Or, a target feature may be a trench, whereas an assist feature may be a hole, and a hole may be generally curved or circular in cross section, or may be polygonal in cross section. In still other examples, the general shapes of target and assist features may be similar to each other and differ in size of a dimension or dimensions.

Also disclosed herein is a method for determining whether an assist feature to be patterned, such as in a resist layer, would possess a dimension whose reduction by a shrinkage process (whether through conformal deposition thereupon or other shrinkage process in accordance with the present disclosure) would result in closing off the assist feature. For example, a size of an assist feature may be determined before it is patterned into a layer, and the magnitude of reduction of one or more of its dimensions according to a shrinkage method maybe determined, and comparison between the magnitude of dimension reduction and the dimension or dimensions of the assist feature can indicate whether the assist feature would be closed off following reduction of one or more of its dimensions.

For example, a potential assist feature may be polygonal, and an inward biasing may be performed according to the amount of reduction of one or more of its dimensions. If the inward bias indicates that the degree of reduction to be imposed would so deform the assist feature as to close the assist feature off, then the assist feature would have possessed a dimension or dimensions reduction of which by a shrinkage process or other method of dimension reduction in accordance with the present disclosure would result in closing off of the assist feature. If, however, such deformation and closing of the assist feature would not result, one or more dimensions of the assist feature to be patterned may be altered, such as to render the assist feature suitable deformable as to be able to be closed off by reduction of one or more of its dimensions in accordance with the shrinkage or other process of dimension reduction of the present disclosure.

In other similar examples, an assist feature to be patterned may have a closed contour shape in cross section. To determine whether such an assist feature may be closed off following reduction of one or more of its dimensions, a measurement circle may be formed and the measurement circle indicates how much reduction would result from application of a shrinkage or other process for reduction of a dimension of an assist feature in accordance with the present invention. If the measurement circle is larger than the closed contour of the assist feature, then the reduction in dimension, indicated by the size, or radius of the measurement circle, would exceed the size of the assist feature, indicating that the reducing would close off the assist feature. If the measurement circle were smaller than the closed contour of the assist feature, then the reducing would not close off the assist feature. If the measurement circle were smaller that the closed contour of the assist feature, then one or more dimensions of the assist feature could be decreased such that the measurement circle is larger than the closed contour, resulting in an assist feature that would become closed off by the reducing.

EXAMPLES

Figure 1B:
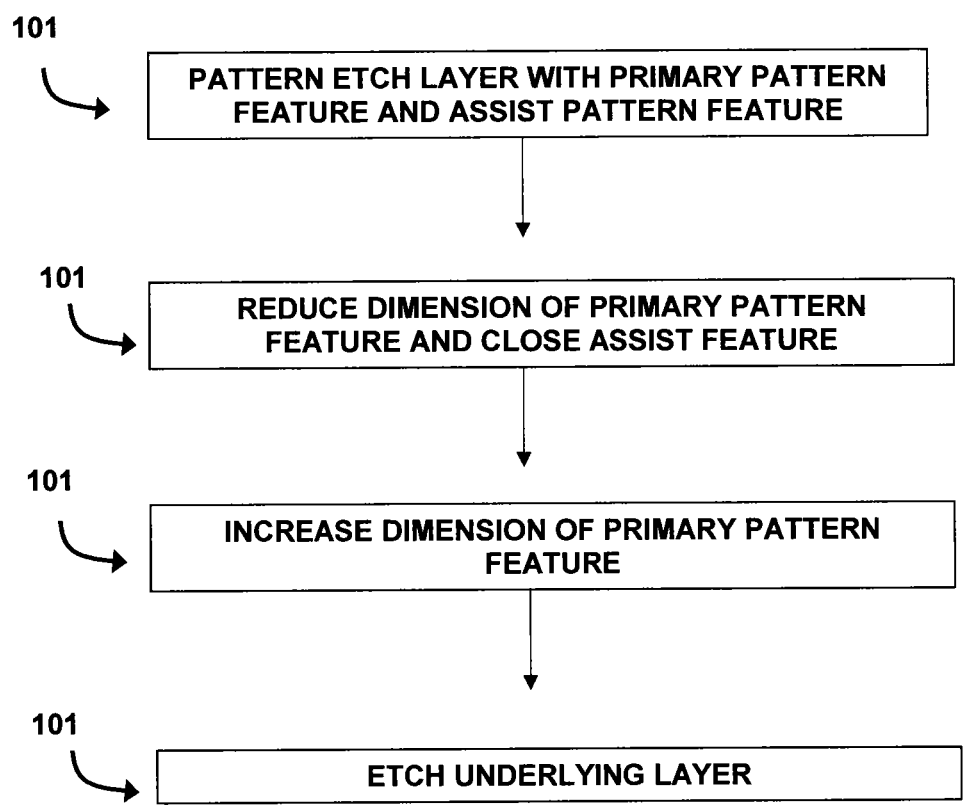
FIG. 1B illustrates a method of semiconductor manufacturing in accordance with another exemplary embodiment of the present disclosure.

FIG. 1A shows a non-limiting example of a process flow in accordance with the present invention. An etch layer, such as a resist layer, is patterned 101 with one or more primary features and one or more assist feature. One or more dimensions of the primary pattern is reduced 105 and the assist features are closed off, either through conformal deposition of another layer on the etch layer or other shrinkage process in accordance with the present disclosure. With the assist features closed off and thereby preventing etching of a layer or layers underlying the etch layer directly beneath the close-off assist features, the layer or layers underlying the etch layer are etched, resulting in transference of the primary features thereto. FIG. 1B shows a modification of the flow shown in FIG. 1A wherein, after the reducing process 105 but before the etching 110, the etch layer itself is etched to increase a dimension or dimensions of a target feature.

Figure 2A:
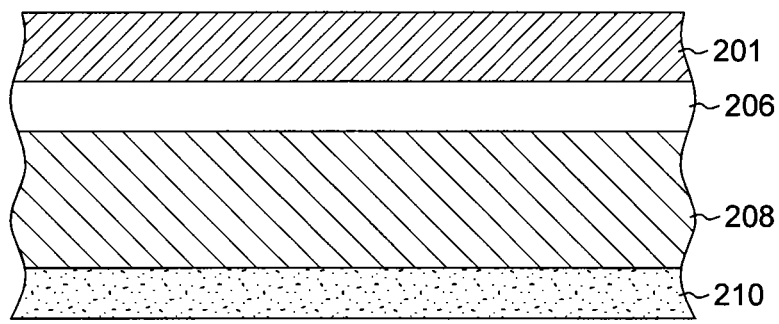
FIG. 2A, FIG. 2B, FIG. 2C, FIG. 2D, and FIG. 2E illustrate an intermediate semiconductor substrate at different stages of manufacturing conducted in accordance with an exemplary embodiment of the present disclosure.
Figure 2B:
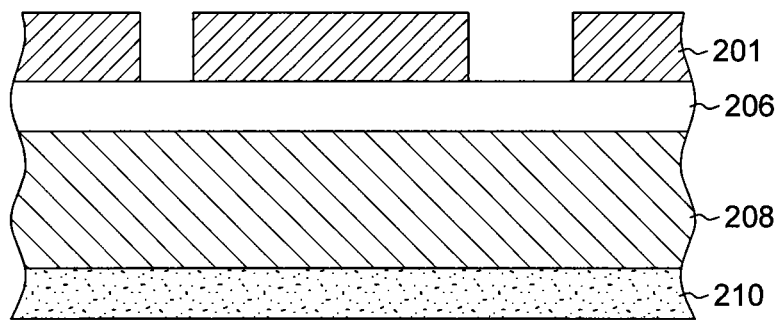
Figure 2C:
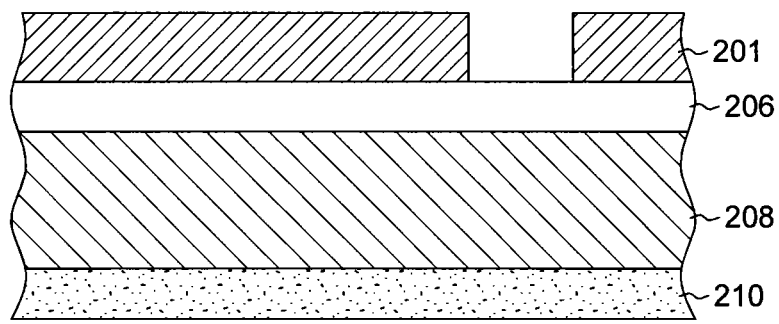

FIGS. 2A-2E show a cross-section of a partial semiconductor structure as it exists during fabrication steps in accordance with the present disclosure, including to processing sequences illustrated in FIG. 1A. In FIG. 2As, a resist layer 201, a hardmask material layer 206 such as a silicon-rich antireflective coating layer underlying the resist layer 201, an etch layer 208 underlying the hardmask material layer 206 in which a target pattern is to be etched, and a feature layer 210 beneath the etch layer 208 in which a target feature may be further formed following etching of the etch layer 208. In FIG. 2B, an assist feature, on the left, and a target feature, on the right, have been patterned into resist layer 201. The target feature is larger in a dimension or dimensions that the assist feature. Standard lithographic processing may be employed to create said features, and may involve us of an optical lithographic mask layer disposed above the resist layer 201. FIG. 2C shows the structure after the dimension(s) of the assist feature and target feature have been reduced in accordance with the present disclosure. As a result of reducing the dimension or dimensions of the assist and target features, the assist feature has been closed off, leaving only the target feature and a dimension or dimensions of the target feature have been reduced.

Figure 2D:
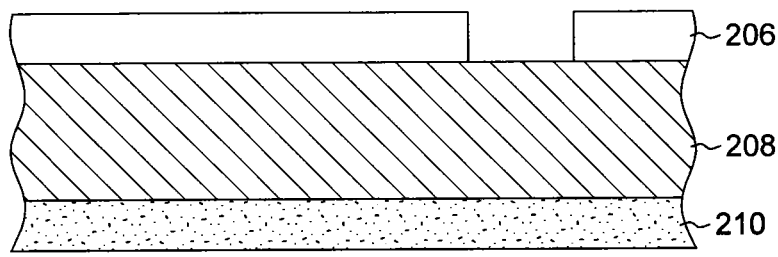
Figure 2E:
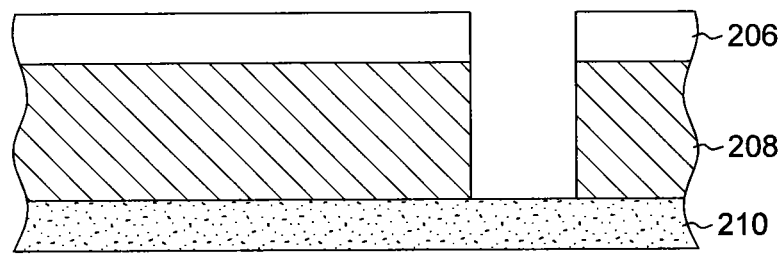

After reducing the target feature and closing off the assist feature, the hardmask layer 206 may be patterned or etched in a region underlying the target feature in the resist layer 201 by a selective etching step selective for the hardmask layer 206 over the resist layer 201 (not shown). Subsequently, as shown in FIG. 2D, the resist layer 201 may be stripped by standard techniques, by a process selective for the resist layer 201 relative to the etch layer 206, leaving the target pattern in the hardmask layer 206 without transference of the assist feature to the hardmask layer 206. In FIG. 2E, the etch layer 208 is selectively etched, by well-known processing methods, selective for the etch layer 208 relative to the hardmask layer 206, permitting subsequent transferrance of the target pattern to the feature layer 210. It would be understood that not all of the steps illustrated in FIGS. 2A-2E would have to be performed for all embodiments in accordance with the present disclosure, and that additional or fewer layers and additional steps could be employed, in keeping with the present disclosure.

Figure 3A:
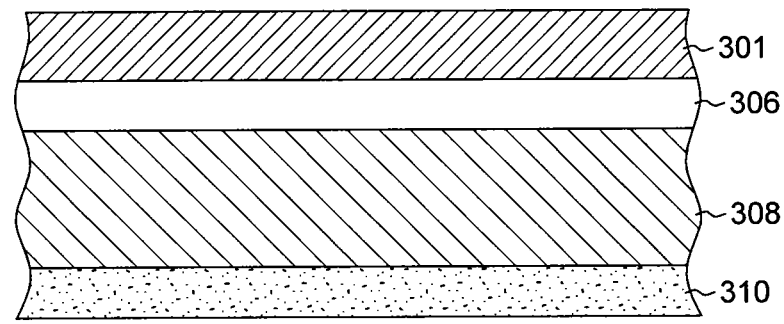
FIG. 3A, FIG. 3B, FIG. 3C, FIG. 3D, FIG. 3E, and FIG. 3F illustrate an intermediate semiconductor substrate at different stages of manufacturing conducted in accordance with another exemplary embodiment of the present disclosure.
Figure 3B:
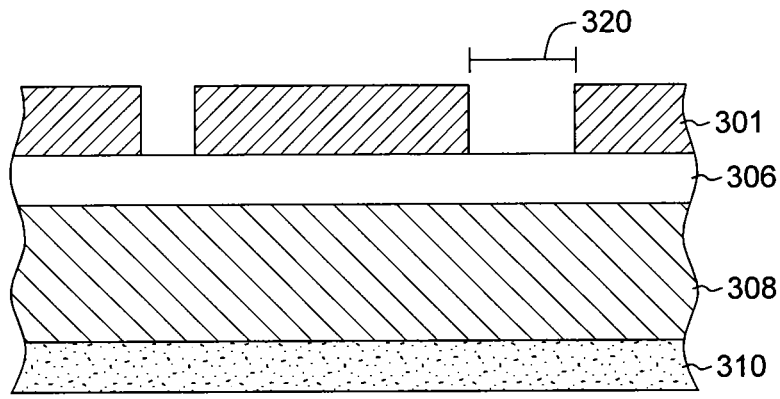
Figure 3C:
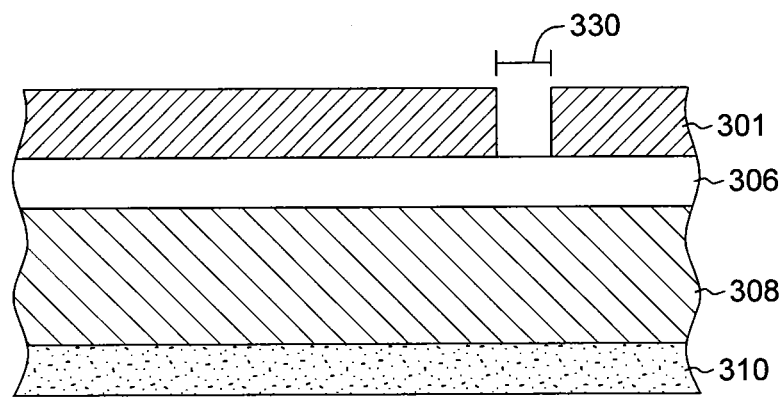

FIGS. 3A-3E show a cross-section of a partial semiconductor structure as it exists during fabrication steps in accordance with the present disclosure, including to processing sequences illustrated in FIG. 1B. In FIG. 3A, a resist layer 301, a hardmask material layer 306 such as a silicon-rich antireflective coating layer underlying the resist layer 301, an etch layer 308 underlying the hardmask material layer 306 in which a target pattern is to be etched, and a feature layer 310 beneath the etch layer 308 in which a target feature may be further formed following etching of the etch layer 308. In FIG. 3B, an assist feature, on the left, and a target feature, on the right, have been patterned into resist layer 301. The target feature is larger in a dimension or dimensions that the assist feature, and is indicated by the dimension bar 320. Standard lithographic processing may be employed to create said features, and may involve us of an optical lithographic mask layer disposed above the resist layer 301. FIG. 3C shows the structure after the dimension(s) of the assist feature and target feature have been reduced in accordance with the present disclosure. As a result of reducing the dimension or dimensions of the assist and target features, the assist feature has been closed off, leaving only the target feature and a dimension or dimensions of the target feature have been reduced.

Figure 3D:
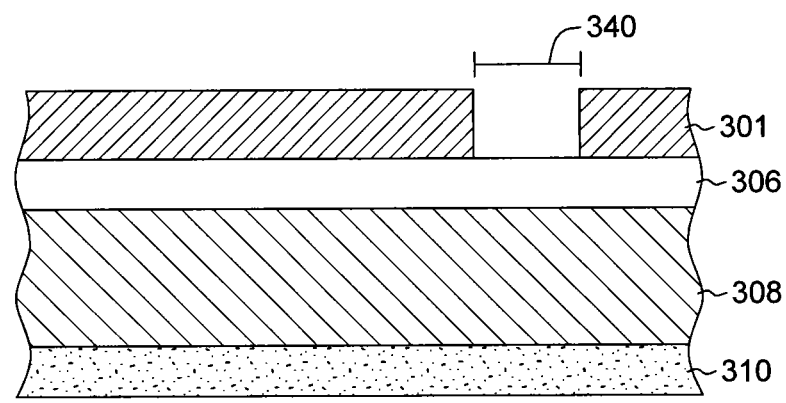

After one or more of its dimensions have been reduced, the target feature possesses a reduced dimension indicated by the reduced dimension bar 320, which is smaller than dimension bar 330. One or more reduced dimensions of the target feature may be of a different dimension than the intended dimension of a penultimate target feature. Thus, as shown in FIG. 3D, an etch step may be performed to increase a dimension of the target feature, resulting in an enlarged dimension indicated by the enlarged dimension bar 340, which is larger than reduced dimension bar 330. A dimension or dimensions of a target feature may be enlarged as desired to accommodate an intended dimension of a penultimate target feature in an underlying layer or layers.

Figure 3E:
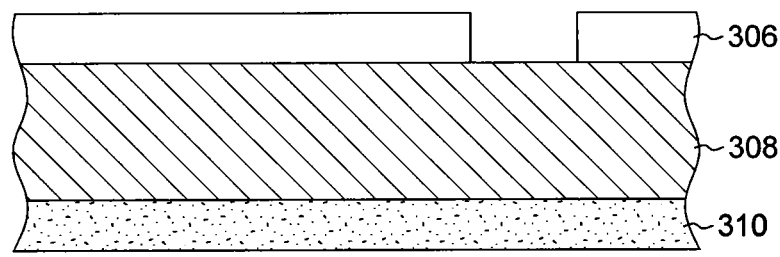
Figure 3F:
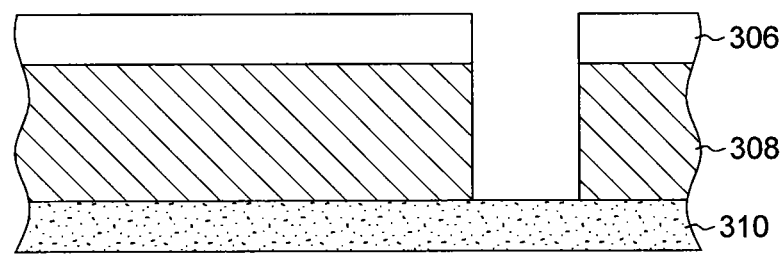

After enlarging the target feature, the hardmask layer 306 may be patterned or etched in a region underlying the target feature in the resist layer 301 by a selective etching step selective for the hardmask layer 306 over the resist layer 301 (not shown). Subsequently, as shown in FIG. 3E, the resist layer 301 may be stripped by standard techniques, by a process selective for the resist layer 301 relative to the etch layer 306, leaving the target pattern in the hardmask layer 306 without transference of the assist feature to the hardmask layer 306. In FIG. 3F, the etch layer 308 is selectively etched, by well-known processing methods, selective for the etch layer 308 relative to the hardmask layer 306, permitting subsequent transferrance of the target pattern to the feature layer 310. It would be understood that not all of the steps illustrated in FIGS. 3A-3F.

Figure 4A:
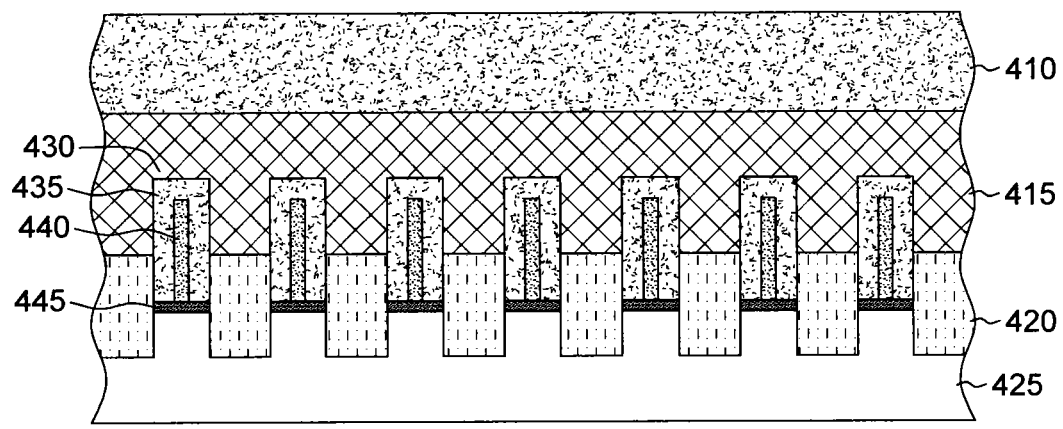
FIG. 4A, FIG. 4B, FIG. 4C, and FIG. 4D illustrate an intermediate semiconductor substrate at different stages of manufacturing conducted in accordance with another exemplary embodiment of the present disclosure.
Figure 4B:
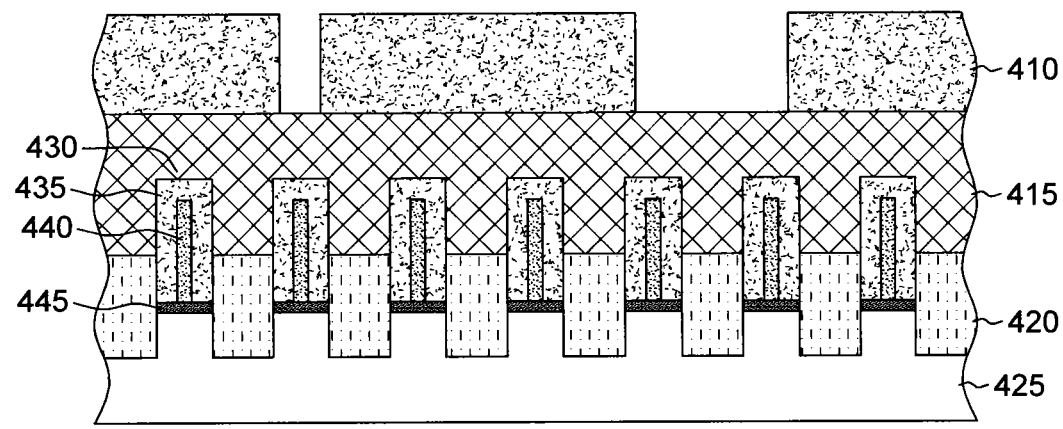
Figure 4C:
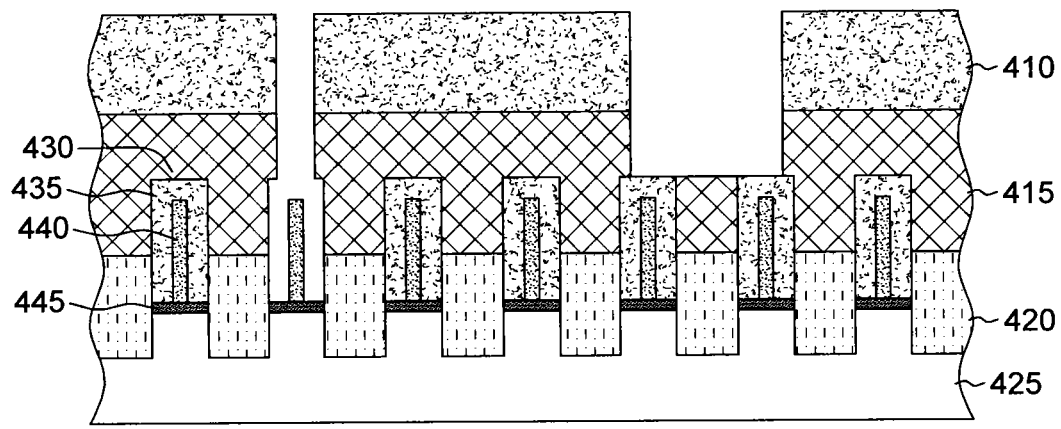

FIGS. 4A-4D illustrate one example of a method in accordance with the present disclosure by which a conformal layer is deposited after formation of an etch feature and an assist feature, such as part of a process for creating a via or contact in a semiconductor structure. In FIG. 4A, several fins 430 are shown extending from a substrate 425. Fins 430 may contain an amorphous silicon portion 440 and an oxide portion 445 between the amorphous silicon portion 440 and the substrate 425. Fins 430 may also contain a hardmask material 435. Above and around the fins 430 may be an etch layer 415, and above the etch layer may be a resist layer 410. In FIG. 4B, an assist feature, or the left, and target feature, on the right, have been formed in the resist layer. In FIG. 4C, etch layer 415 has been etched according to the location of the assist feature and target feature, by an etch process selective for the etch layer 415 over the resist layer 410, resulting of transfer of the assist feature and the target feature to the etch layer 415.

Figure 4D:
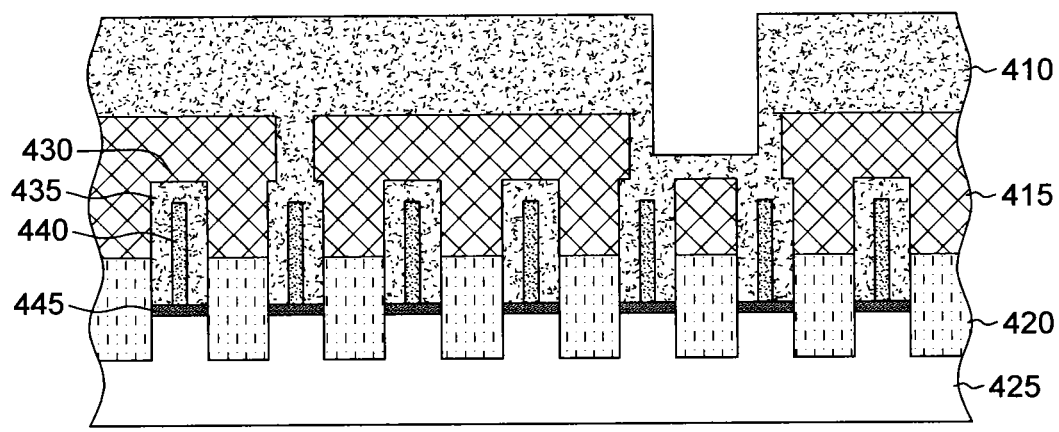

In FIG. 4D, in accordance with the present invention, a dimension or dimensions of an assist layer and a target layer have been reduced, such as by deposition of more material such as by atomic layer deposition, or modifying the resist layer to cause shrinkage of features in accordance with processes disclosed above. As a result, the assist feature has closed off. A dimension or dimensions of the target feature has also been reduced. If desired, sidewalls and/or the bottom layer of the target feature may be etched to enlarge one or more dimensions of the target feature and/or expose the underlying hardmask layer 435 of fins 430. In subsequent processing, not shown, gate contacts can be formed in the target feature.

While at least some exemplary embodiments have been presented in the foregoing detailed description of the disclosure, it should be appreciated that a vast number of variations exist. It should also be appreciated that an exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method of fabricating a circuit structure feature, the fabricating comprising:
   providing a circuit structure layer over a substrate and a plurality of etch layers over the circuit structure layer;
   forming a pattern in at least one of the plurality of etch layers wherein forming comprises patterning at least one primary pattern feature having at least one primary pattern feature dimension and a plurality of assist pattern features having at least one assist pattern feature dimension, where the primary pattern feature dimension is greater than the assist pattern feature dimension and at least one of the plurality of assist pattern features is formed in one etch layer of the plurality of etch layers without being formed in other layers of the plurality of etch layers;
   reducing the at least one primary pattern feature dimension and closing at least one assist pattern feature to form an etch pattern; and
   etching the circuit structure feature using the etch pattern, wherein the plurality of assist features are arranged asymmetrically with respect to each other.

2. The method of claim 1, wherein at least one etch layer of the plurality of etch layers comprises a photo-resist layer, and wherein the other layers of the plurality of etch layers comprise an anti-reflective coating layer disposed below the photo-resist layer and an organic planar layer disposed below the anti-reflective coating layer.

3. The method of claim 1, wherein at least one etch layer of the plurality of etch layers comprises a hard mask layer, and wherein the other layers of the plurality of etch layers comprise an anti-reflective coating layer disposed below the photo-resist layer and an organic planar layer disposed below the anti-reflective coating layer.

4. The method of claim 1, further comprising increasing the at least one dimension of the primary pattern feature after reducing the at least one dimension of the primary pattern feature.

5. The method of claim 1, wherein the at least one dimension of the primary pattern feature comprises a length of the primary pattern feature.

6. The method of claim 1, wherein the at least one dimension of the primary pattern feature comprises a width of the primary pattern feature.

7. The method of claim 1, wherein the plurality of assist feature dimensions are smaller than the at least one primary feature dimension.

8. The method of claim 1, wherein at least one of the plurality of the assist features comprises at least one polygon-shaped hole formed in the at least one etch layer.

9. The method of claim 1, wherein the plurality of assist features further facilitate forming the primary pattern feature.

10. The method of claim 1, wherein the asymmetrically arranged plurality of assist features have a variable spacing between one assist feature and one or more adjacent assist features.

11. The method of claim 9, wherein the plurality of assist features comprise a plurality of polygon-shaped holes.

12. A method of fabricating a circuit structure feature, the fabricating comprising:
providing a circuit structure layer over a substrate and at least one etch layer over the circuit structure layer;
forming a pattern in the at least one etch layer wherein forming comprises patterning at least one primary pattern feature having at least one primary pattern feature dimension and at least one assist pattern feature having at least one assist pattern feature dimension, where the primary pattern feature dimension is greater than the assist pattern feature dimension, wherein the patterning the at least one etch layer is performed after determining if the at least one assist feature may be completely closed by the reducing the at least one dimension of the primary pattern feature;
reducing the at least one primary pattern feature dimension and closing the assist pattern feature to form an etch pattern; and
etching the circuit structure feature using the etch pattern, wherein the primary pattern feature comprises a trench formed in the at least one etch layer, and wherein reducing the at least one dimension of the primary pattern feature comprises depositing a material over the at least one etch layer, the material at least partially filling the trench to reduce the at least one dimension of the primary pattern feature.

13. The method of claim 12, wherein the material comprises a hard mask layer.

14. The method of claim 12, wherein the at least one assist feature comprises a polygon-shaped assist feature, and wherein the determining comprises applying an inward bias to the polygon shape of the assist feature, the inward bias corresponding to the reducing, to detect whether the polygon shape deforms as a result of applying the inward bias, the deformation corresponding to complete closure of the at least one assist feature.

15. The method of claim 14, wherein the polygon shape does not deform as a result of applying the inward bias, and further comprising altering one or more dimensions of the at least one assist feature so that the at least one assist feature will be completely closed by the reducing.

16. The method of claim 12, wherein the at least one assist feature comprises a shape defined by a closed contour, and wherein the determining comprises providing a measurement circle, the measurement circle having a radius corresponding to the reducing, and comparing the measurement circle to the closed contour of the at least one assist feature to detect if the circle is larger than the closed contour.

17. The method of claim 16, wherein the measurement circle is smaller than the closed contour, the measurement circle being smaller than the closed contour corresponding to incomplete closure of the at least one assist feature, and further comprising altering one or more dimensions of the at least one assist feature so that the at least one assist feature will be completely closed by the reducing.

* * * * *